(12) United States Patent
Orlowski et al.

(10) Patent No.: US 6,236,600 B1
(45) Date of Patent: May 22, 2001

(54) INHIBITING MEMORY DATA BURN-IN

(75) Inventors: Pawel A. B. Orlowski, Hull; Martin J. Williams, Wirral, both of (GB)

(73) Assignee: Marconi Communications Limited (GB)

( * ) Notice: Subject to any disclaimer, the term of this patent is extended or adjusted under 35 U.S.C. 154(b) by 0 days.

(21) Appl. No.: 09/498,091

(22) Filed: Feb. 4, 2000

(30) Foreign Application Priority Data

Feb. 5, 1999 (GB) .................................................. 9902560

(51) Int. Cl.⁷ ...................................................... G11C 7/00
(52) U.S. Cl. ........................ 365/195; 365/190; 365/189.04
(58) Field of Search ............................... 365/195, 189.04, 365/236, 233, 190

(56) References Cited

U.S. PATENT DOCUMENTS

| | | |
|---|---|---|
| 3,786,437 | 1/1974 | Croxon et al. . |
| 5,124,584 * | 6/1992 | McClure ............................. 307/480 |
| 5,457,748 | 10/1995 | Bergum et al. . |
| 5,493,530 * | 2/1996 | Lee et al. ......................... 365/189.05 |
| 5,764,591 * | 6/1998 | Matsui et al. ..................... 365/233.5 |

FOREIGN PATENT DOCUMENTS

| | | |
|---|---|---|
| 0 575 765 A1 | 12/1993 | (EP) . |
| 0 667 621 A2 | 8/1995 | (EP) . |

\* cited by examiner

*Primary Examiner*—David Nelms
*Assistant Examiner*—Thong Le
(74) *Attorney, Agent, or Firm*—Kirschstein, et al.

(57) ABSTRACT

Where the same data is stored for an extended period of time, the possibility exists of unwanted burning in of the data which would allow undesired recovery of erased data even after it has been over-written or the memory has been powered down. The memory contents are therefore periodically rewritten in the inverse of their former state, either to the same location in which they were previously stored, or elsewhere. Inversion may be performed in an invert cycle during which address decoders driven by a high speed oscillator read each cell and write back its contents inverted. On completion of a cycle, a latch may indicate whether the stored data is in a true or complement form. The latch may control programmable invertors so that cells are always read or written correctly, regardless of whether data happens to be in true or complement form.

13 Claims, 2 Drawing Sheets

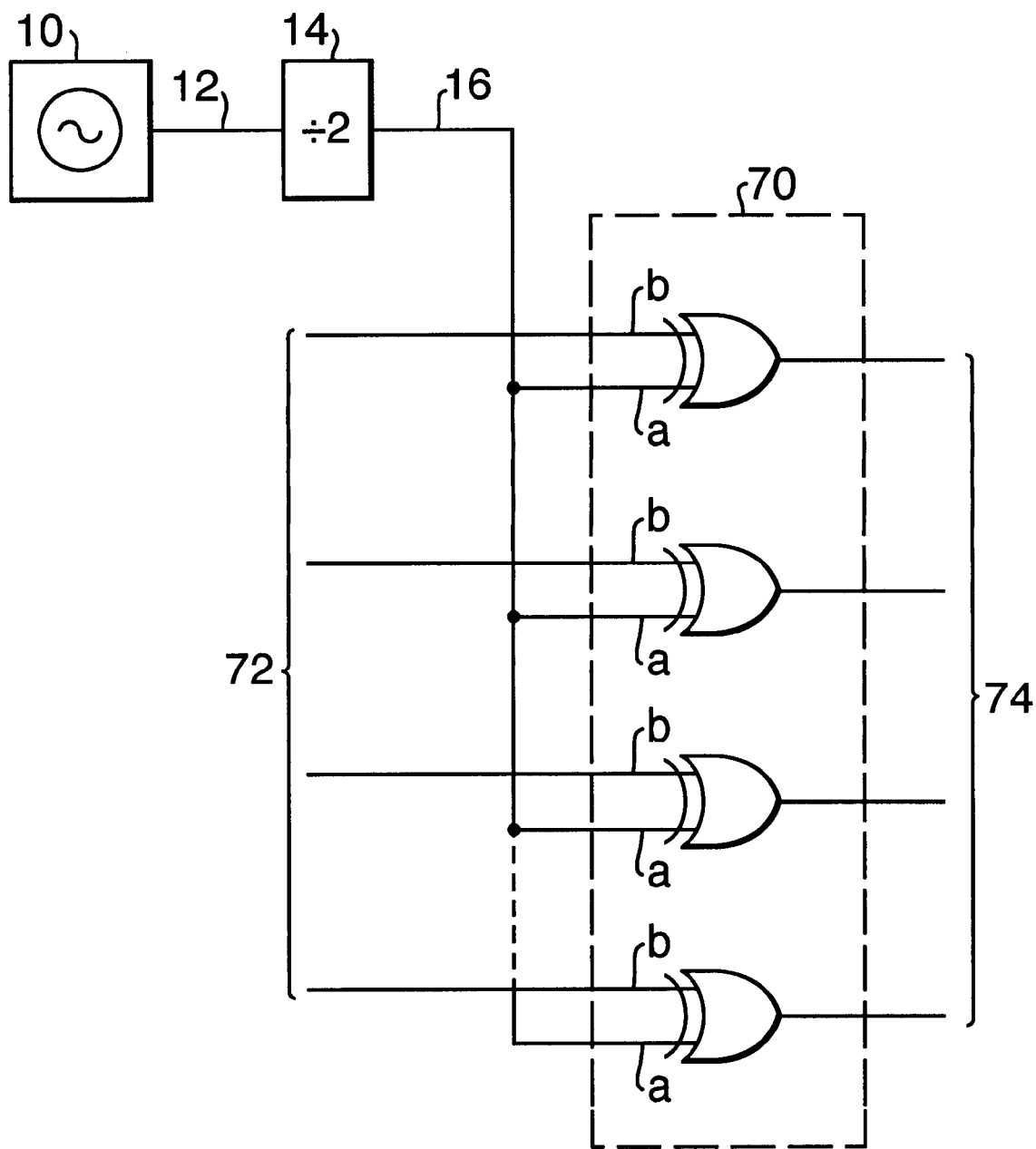

INHIBITING MEMORY DATA BURN-IN

BACKGROUND OF THE INVENTION

Studies into the behavior of volatile semiconductor RAM memories when power has been removed show that under certain conditions, it is possible to recover the data held within the device on the re-application of device power. Furthermore, it has been suggested that even after the overwriting of a particular RAM location, upon removal and re-application of device power, there is an increased probability that the location under test will assume the state which existed prior to overwrite. The success of this data recovery mechanism is believed to be dependent on the length of time a particular location has been in the same state. When a cell has stored a bit for a long period, it acquires an increased propensity to set up in the same polarity on powering up, even when it has been erased before powering down. The longer the cell holds the data, the stronger this propensity becomes.

This data recovery mechanism is of great significance in cryptographic equipments, where Key Variables (KVs) are held in volatile RAM (often battery backed) for some considerable time. It has hitherto been considered sufficient to effect an assured erase on KV holding elements within these cryptographic equipments as a countermeasure to KV compromise. An assured erase is taken to mean writing known data to the memory device, and reading it back after writing to make sure that the write operation and hence data obliteration has been successful.

This data recovery mechanism is an extremely serious threat to security when capture of equipment is possible, because it may allow unauthorized persons to recover part of the KV, even after an assured erasure. One might conceive of attacks in which exhaustive search for a working KV is made easier by choosing vectors close (in the sense of Hamming distance) to the observed power-on set-up state of the register or memory location where the KV was held. This vulnerability is amplified where KVs are used to encrypt other bulk cryptographic information, and these KVs are not changed very often, typically many months, which will obviously leave a more substantial 'ghost image'.

SUMMARY OF THE INVENTION

The present invention seeks to at least ameliorate the problem of data recovery mechanism.

A first aspect of the invention provides a method of operating a memory to inhibit bias build-up in the cells of the memory in which the contents of the memory locations of the memory are periodically inverted such that, after each inversion, the data is stored in the complementary logical state to its state prior to the inversion.

A second aspect of the invention provides apparatus for operating a memory to inhibit bias build-up in the cells of the memory, comprising control means and invertor means, the control means being arranged to periodically read out each item of data from each memory location of the memory, invert the data read out using the invertor means, and to write the inverted item of data back into the memory whereby on completion of the inverting phase data is stored in the memory in the complement of its state prior to the inverting phase.

BRIEF DESCRIPTION OF THE DRAWINGS

Embodiments of the invention will now be described by way of non-limiting example only, with reference to the drawings in which, FIG. 2 shows a block diagram of a circuit for use with the invention.

DETAILED DESCRIPTION OF THE PREFERRED EMBODIMENTS

Figure 1:
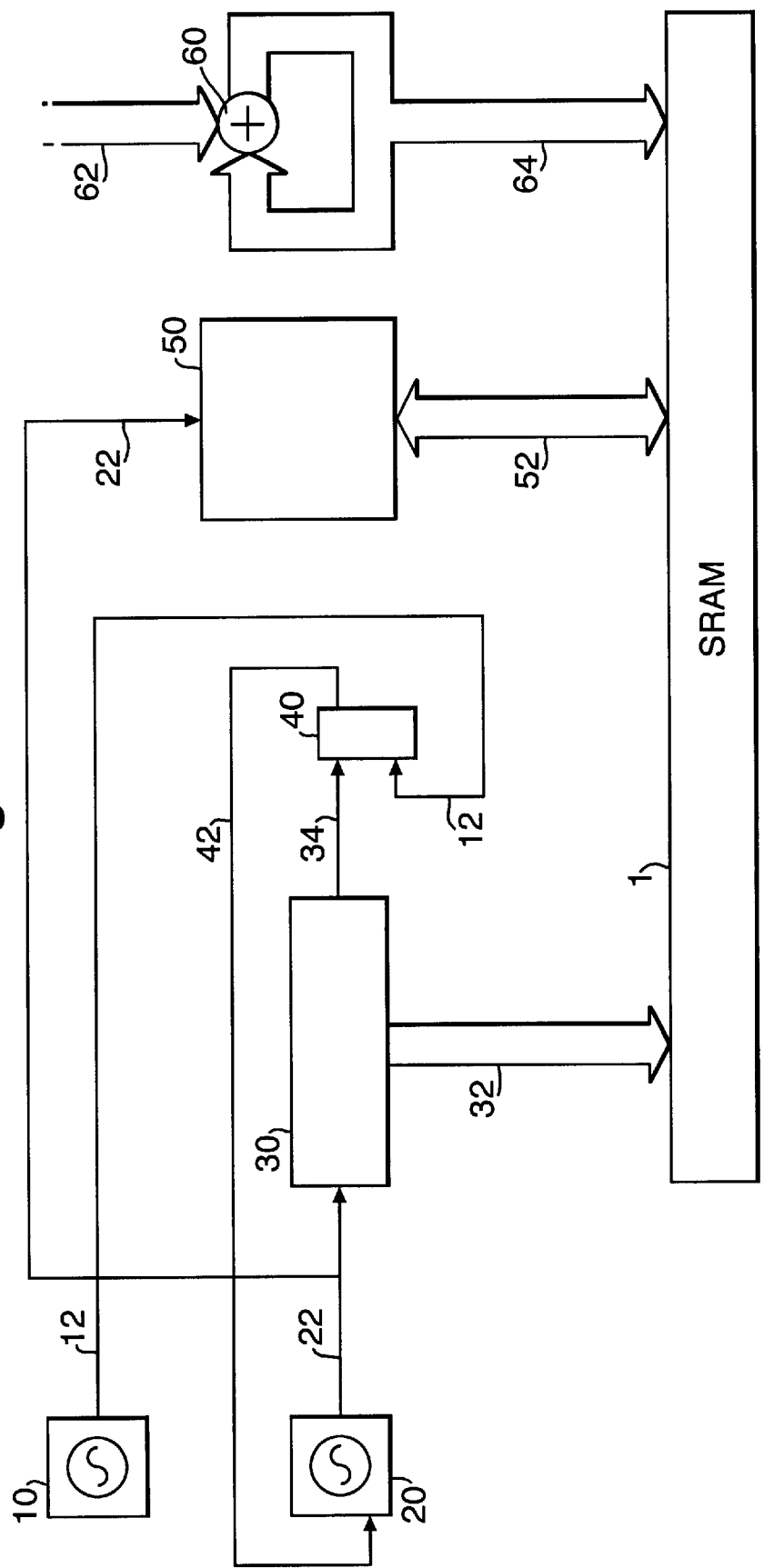
FIG. 1 shows a block diagram of a circuit for carrying out the invention.

Referring to FIG. 1, a low speed oscillator 10 produces output pulses on line 12 at a rate of about 1 Hz. Thus about once a second, a pulse on line 12 sets the output of a flip-flop 40, which enables a high speed oscillator 20 via line 42. The output of oscillator 20 is fed to a clock input of binary counter 30 and to an input of control logic 50 via line 22. Binary counter 30 has as many stages as there are bits in the address bus for a static RAM (SRAM) 1. The Static Ram 1 is of conventional type and will not be described further. The output of counter 30 drives address lines 32 of SRAM 1. When counter 30 has cycled through all RAM addresses, it produces an output signal on line 34 which resets flip-flip 40, thereby stopping high speed oscillator 20.

All the addresses in the SRAM are therefore addressed once during the time that the high speed oscillator 20 is enabled (the data inversion phase). During the data inversion phase, control lines 52 of SRAM 1 are manipulated by control logic 50 which causes each byte in the SRAM to emerge in turn onto data lines 64 of SRAM 1. Each byte that emerges on data lines 64 is passed through a bank of EXCLUSIVE-OR gates 60 where each bit is XORed with respective binary ones on lines 62. Each respective output byte is thus inverted from its former state. Control logic 50 then causes each inverted output byte to be written back into the SRAM. In the present embodiment, data is written back in the same location from which it was read.

It will be seen that, on completion of the data inversion phase, the logical state of each memory cell of the memory is now the opposite of its state prior to the commencement of the data inversion phase.

This relatively sort data inversion phase is followed by a relatively long data access phase during which data can be read and written as required. When oscillator 10 produces its next output pulse, the data access phase terminates and another data inversion phase commences. The cycle is repeated with each output pulse from oscillator 10.

If the data was in the TRUE state originally, it will be in COMPLEMENT state after inversion. A further inversion will return data to the TRUE state.

This repetitive reversal prevents any bias built-up in the memory cells. Any tendency for a memory cell property to be changed during one data access phase due to its logical state will be counterbalanced by the cell being in the opposite logical state in the following data access cycle. If all data access phases are of the same duration, then, over a period of use, all memory cells will have spent the same time in both logical states. Thus there will be no differential stressing of cells which might otherwise allow the cell contents to be determined after data erasure, irrespective of how frequently or infrequently the stored data is changed.

It will be appreciated that, during the data inversion phase, data will not be available. However, the data inversion phase only lasts for a relative small time period in the operating cycle of the memory. In a crypto application, data may not need to be accessed very often, so the very short and relatively infrequent periods of non-availability of data are of little practical consequence. In applications where high speed instantaneous access or low current drain is a requirement, data inversion can be carried out at longer intervals.

It will be appreciated that, because the memory contents are inverted in alternate cycles, it is necessary to know which cycle the memory is in in order to ascertain whether a byte read from the memory is in true or complement form. A number of ways in which this decoding can be done will be evident to the skilled person. One way is to provide a divide-by two stage driven by the output of the low-frequency clock source. The processor which reads the output data can sense the state of the divide by two stage and thus know whether or not to invert the output data. This has the advantage that none of the memory circuitry, including the output drivers, is operated under conditions which might cause bias to build up. The same considerations apply, mutatis mutandis, to reading data into the memory.

Another way is to provide a programmable invertor in each of the data output lines, the invertors being switched between inverting and non-inverting modes in alternate cycles so that output data is always of the correct polarity. One way of implementing this is shown schematically in FIG. 2.

The output of the low-frequency oscillator is divided by two in divider 14. The output of divider 14 one line 16 changes state with each counting phase. In this embodiment the output is logic 0 for even-numbered cycles and logic 1 for odd-numbered cycles, and the data stored in the memory is TRUE during even cycles and COMPLEMENT during odd cycles. The divider output is applied to respective first inputs a of an array 70 of EXCLUSIVE-OR gates whose respective second inputs b are coupled to respective lines of the data bus 72 of the memory. Output data appears at the outputs of the EXCLUSIVE-OR gate and is coupled to an output bus 74.

During even cycles, the logic 0 at the first inputs a of the gates 70 means that each gate acts as a buffer, thereby not inverting the output data. The TRUE data on bus 72 therefore appears as TRUE data on bus 74.

During odd cycles, a logic 1 at the first inputs of the gates means that each gate acts as an invertor. The COMPLEMENT data on bus 72 therefore appears as TRUE data on bus 74. Thus TRUE data is always present on bus 74 irrespective of whether the data in the memory is stored TRUE or COMPLEMENT form.

The above described arrangements allow a conventional SRAM to be used, but do require additional circuits external to the SRAM package to effect the data read/write cycles.

A number of modifications is possible within the scope of the invention. By incorporating provision for ensuring that the output data is always TRUE, it is possible to provide a RAM and the necessary peripheral control circuitry in a single integrated circuit package which is pin-compatible with a conventional static RAM. The internal data reversal is then transparent to the user and allows the invention to be applied to existing equipment by simply replacing a conventional SRAM by a SRAM in accordance with the invention.

It will be evident to the skilled person that if the invention is applied to memories of the type which incorporate a WAIT facility, for example to deal with simultaneous READ and WRITE requests, then external READ or WRITE requests which occur during a data inversion cycle can be inhibited until data inversion has finished.

A number of techniques can be used to emulate a memory which needs to be capable of being written to, or read from, substantially instantaneously. One approach would be to partition the memory into two halves, each storing the same data. One half or the other would then always be available for reading from or writing to, even if a READ request occurred during an INVERT cycle. The data stored in one half is then written to a corresponding location in the other half. Later, the data in the second half is written back into the original location in the first half. It would of course be necessary for only one of the WRITE operations to invert the data, otherwise the data would be written back in its original location in its original state.

Alternatively the INVERT cycle could simply be interrupted if a READ or WRITE request occurred during the INVERT cycle. The skilled person will be aware of the conventional techniques for dealing with conflicting requests for data in digital systems and these will not be discussed further.

While the above-described embodiments referred to reading back data into the same memory location from which it was originally read, this is not essential. As long as there is sufficient redundant capacity, data can be read back into a different location. However, this requires a somewhat more complex address scheme to allow data to be accessed. For example, by providing a buffer sufficiently large to accommodate a reasonable quantity of data (e.g., a row or column data) data from memory location A can be read into the buffer and stored temporarily while data from another location B is inverted and read into the memory location A, thereby overwriting the data now in the buffer. The buffered data can now be read into the memory location B without inversion. In a subsequent cycle data now in A is buffered while data now in B in inverted and written back into A. Data in the buffer is now written back into B without inversion. After these two data transfer cycles, data in A and B are both back in their original locations but are the complement of their former states. The same buffer can be used for other pairs of locations. This can have the advantage of requiring a minimal amount of extra memory rather than a doubling of the memory size. Data could just as well be inverted while being read into the buffer while read out of the buffer, in either case direct transfer between memory locations not involving the buffer being read without inversion.

While the invention has been described with reference to the memories of the SRAM type, the invention may also be applied with advantage to any type of data storage where, but for the invention, long-term storage of unvarying data could result in burn-in sufficient to allow at least partial recovery of data.

Thus a conventional non-volatile RAM which stored the same value for a long time could have the properties of its memory locations differentially altered such that the original data could be detected even after the original data had been overwritten, e.g., by the fact that the threshold voltages of different transistors which had previously stored different logical states, were slightly different even after writing them to the same logical state to erase the previously-stored data. Periodic automatic inversion of stored data in accordance with the invention will stress all storage transistors equally, making it more difficult to detect previous states after data erasure.

What is claimed is:

1. A method of operating a memory having memory locations to inhibit bias build-up, comprising the steps of:
   a) storing data having logical states as initially stored data in respective memory locations; and
   b) periodically inverting the initially stored data to inverted data having complementary logical states by reading the initially stored data from the respective memory locations, and by writing the inverted data back to said respective memory locations from which the initially stored data was read.

2. The method of claim 1; and further comprising the step of producing a signal having signal states corresponding to the logical states of the data.

3. The method of claim 1, wherein the inverting step is performed by the step of reading the initially stored data from a first part of the memory as first read data during a first read operation, the step of writing the first read data to a second part of the memory as first written data during a first writing operation, the step of reading the first written data from the second part of the memory as second read data during a second read operation, the step of writing the second read data to the first part of the memory as second written data during a second writing operation, and the step of changing the logical state during one of the writing operations.

4. The method of claim 3, wherein the step of reading during the first read operation is performed at a set of memory locations in the first part of the memory, and wherein the step of writing during the second writing operation is performed at said set of memory locations in the first part of the memory.

5. The method of claim 1; and further comprising the step of accessing a logical polarity at each of the memory locations, and wherein the inverting step is performed in correspondence with the accessing step.

6. The method of claim 1, wherein the inverting step is performed in sequence by reading and inverting the logical state of each item of the initially stored data, and by writing each item of the inverted data, and wherein the sequence is repeated for all items of the initially stored data.

7. The method of claim 1, wherein the storing step is performed by storing a data word in each memory location which comprises a plurality of cells.

8. An apparatus for operating a memory having memory locations in inhibit bias build-up, comprising:
   a) a controller for storing data having logical states as initially stored data in respective memory locations; and
   b) an inverter for periodically inverting the initially stored data to inverted data having complementary logical states by reading the initially stored data from the respective memory locations, and by writing the inverted data back to said respective memory locations from which the initially stored data was read.

9. The apparatus of claim 8; and further comprising a logical status indicator for producing a status signal having signal states corresponding to the logical states of the data.

10. The apparatus of claim 9; and further comprising a selective polarity inverter responsive to the status signal, for accessing a logical polarity at each of the memory locations, and for aligning the logical polarity at each of the memory locations with one of the logical states of the data.

11. The apparatus of claim 9, wherein the inverter includes a counter having outputs; a gated, relatively high frequency, signal source; and a coupler for coupling the outputs of the counter to the memory; and wherein the counter counts and the signal source is enabled during the inverting of the initially stored data; and an inhibitor for inhibiting the enabled signal source after the inverting of the initially stored data.

12. The apparatus of claim 9, wherein the controller and the inverter are constructed and assembled in an integrated circuit assembly.

13. A memory combination, comprising:
   a) a memory having memory locations; and
   b) an apparatus for operating the memory to inhibit bias build-up, the apparatus including:
      i) a controller for storing data having logical states as initially stored data in respective memory locations; and
      ii) an inverter for periodically inverting the initially stored data to inverted data having complementary logical states by reading the initially stored data from the respective memory locations, and by writing the inverted data back to said respective memory locations from which the initially stored data was read.

* * * * *